(12) United States Patent
Su

(10) Patent No.: US 8,551,628 B2
(45) Date of Patent: Oct. 8, 2013

(54) COMPOSITE MATERIAL, HIGH-FREQUENCY CIRCUIT SUBSTRATE MADE THEREFROM AND MAKING METHOD THEREOF

(75) Inventor: Min She Su, Dongguan (CN)

(73) Assignee: Guangdong Shengyi Sci. Tech Co., Ltd. (CN)

( * ) Notice: Subject to any disclaimer, the term of this patent is extended or adjusted under 35 U.S.C. 154(b) by 1224 days.

(21) Appl. No.: 12/267,198

(22) Filed: Nov. 7, 2008

(65) Prior Publication Data
US 2010/0021687 A1 Jan. 28, 2010

(30) Foreign Application Priority Data
Jul. 28, 2008 (CN) .......................... 2008 1 0142665

(51) Int. Cl.
*B32B 5/02* (2006.01)
*B32B 27/04* (2006.01)
*B32B 27/12* (2006.01)

(52) U.S. Cl.
USPC ............ 428/901; 442/110; 442/117; 442/180

(58) Field of Classification Search
USPC .......................... 442/110, 117, 180; 428/901
See application file for complete search history.

(56) References Cited

U.S. PATENT DOCUMENTS 6,306,963 B1 * 10/2001 Lane et al. ........................ 525/68
6,333,384 B1 * 12/2001 Lane et al. ...................... 525/124

* cited by examiner

*Primary Examiner* — Lynda Salvatore
(74) *Attorney, Agent, or Firm* — McDonald Hopkins LLC

(57) ABSTRACT

A composite material, a high-frequency circuit substrate made from the composite material, and a method of making the high-frequency circuit substrate. The composite material includes: a thermosetting composition including a butadiene styrene copolymer resin with a molecular weight less than 11,000 containing more than 60 percent of vinyl, a polybutadiene resin with polarity groups containing more than 60 percent vinyl, and a maleic anhydride grafted polybutadiene styrene copolymer with a molecular weight of more than 50,000; a fiberglass cloth; a powder filler; and a cure initiator. The composite material permits easy manufacture of the prepreg and high bonding of the copper foil. The high-frequency circuit substrate made from the composite material has low dielectric constant, low dielectric loss tangent, and excellent heat resistance, and is convenient for the processing operation. The composite material is suitable for making the circuit substrate.

10 Claims, No Drawings

COMPOSITE MATERIAL, HIGH-FREQUENCY CIRCUIT SUBSTRATE MADE THEREFROM AND MAKING METHOD THEREOF

FIELD OF THE INVENTION

The invention relates to a composite material, a high-frequency circuit substrate made therefrom and a method of making same, particularly to a thermosetting dielectric composite material, a high-frequency circuit substrate made therefrom and a method of making same.

BACKGROUND OF THE INVENTION

In recent years, with the development of high-properties and networking of computer and information communication equipment, to reach high-speed transmission and deal with large-capacity information, operation signals tend to be high-frequency. Therefore, the material of the circuit substrate material must be improved.

Among the conventional materials used for the printed circuit substrate, epoxy resin with excellent adhesion characteristics is widely used. However, the epoxy resin circuit substrate has a relatively high dielectric constant and a dielectric loss tangent (dielectric constant is more than 4, dielectric loss tangent is around 0.02), and inadequate high-frequency characteristics, which results in failure to meet the requirement of high-frequency signals. Therefore, it is necessary to use resins with excellent dielectric properties i.e., the resin must have a low dielectric constant and dielectric loss tangent. For a long time, technicians in the field have studied thermosetting polybutadiene or butadiene copolymer resins with excellent dielectric properties. The results of these studies are cited as follows:

European patent application No. WO97/38564 discloses the use of nonpolar styrene-polybutadiene divinyl benzene terpolymer added with magnesium aluminum silicate as a filler, and the use fiberglass cloth as a reinforcing material to make a circuit substrate which has excellent dielectric properties but poor peel strength.

U.S. Pat. No. 5,571,609 discloses the use of 1,2-polybutadiene resin or polyisoprene with a molecular weight of less than 5,000, and nonpolar butadiene styrene copolymer with a high molecular weight, with silica as a filler, and the use of fiberglass cloth as a reinforcing material to make a circuit substrate which also has excellent dielectric properties but poor peel strength.

U.S. Pat. No. 6,569,943 discloses the use of amine modifer polybutadiene liquid resin with vinyl added with monomers of low molecular weight as a curing agent and diluent, and the use of impregnated fiberglass cloth to make a circuit substrate. Although the dielectric properties and peel strength are excellent, the resin system is liquid at normal temperature, and so can not be made into a tack-free prepreg. Therefore, in the compression molding of a sheet, it is difficult to adopt common stacked technology of the prepreg, which results in a difficult process operation.

Among the above-mentioned disclosures, the resin used in the first two patents is a non-polar resin material. Although the resulting circuit substrate has excellent dielectric properties and high-frequency properties, the molecular structure of the resin material not have polarity groups to help improve the adhesion properties, making the adhesiveness of the circuit substrate copper foils poor (peel strength less than 0.8 N/mm). In the fabrication process of the circuit substrate, the circuit substrate must withstand high-temperature or reflow welding, and the low peel strength of the copper foil reduces reliability and increases the risk of the failure of circuits. In addition, the other patent discloses the use of an amine modifer polybutadiene liquid resin with vinyl in the end having polarity groups in the molecular structure to improve the peel strength. However, it does not solve the tackiness problem of the liquid resin, and so does not make a prepreg which is convenient to operate, which results in poor process operability.

SUMMARY OF THE INVENTION

An object of the present invention is to provide a composite material which comprises a high content vinyl-containing butadiene styrene copolymer resin, a high content vinyl-containing polybutadiene resin with polarity groups, and a maleic anhydride grafted polybutadiene styrene copolymer with a high molecular weight, thereby providing a high-frequency circuit substrate with adequate high-frequency dielectric properties, high temperature resistance and high peel strength of the circuit substrate.

Another object of the present invention is to provide the high-frequency circuit substrate made by the above-mentioned composite material, having high-frequency dielectric properties, high temperature resistance and high peel strength of the circuit substrate.

A further object of the present invention is to provide a method of making the above-mentioned high-frequency circuit substrate, which through improving the resin system of the composite material and impregnating the fiberglass cloth to make a tack-free prepreg, can adopt common automatic stacked technology of the prepreg in the compression molding of the sheet, whereby the fabrication operation is more convenient.

To achieve the above objects, a composite material of the present invention comprising:

(1) a thermosetting composition in an amount of 15 to 50 by weight with respect to the composite material (according to the total weight of the composite material), comprising a butadiene styrene copolymer resin with a molecular weight less than 11,000 containing more than 60 percent of vinyl, a polybutadiene resin with polarity groups containing more than 60 percent of vinyl, and a maleic anhydride grafted polybutadiene styrene copolymer with a molecular weight of more than 50,000;

(2) a fiberglass cloth in an amount of 10 to 35 by weight with respect to the composite material;

(3) a powder filler in an amount of 25 to 55 by weight with respect to the composite material; and (4) a cure initiator in an amount of 1 to 3 by weight with respect to the composite material.

A high-frequency circuit substrate made from the composite material, comprising: a plurality of prepregs mutually overlapped, and copper foils respectively disposed at both sides of the overlapped prepregs, wherein each prepreg is made from the composite material.

A method of making the high-frequency circuit substrate including the following steps:

Step 1: providing components of composite material comprising: (1) a thermosetting composition in an amount of 15 to 50 by weight (according to the total weight of the composite material) comprising: a butadiene styrene copolymer resin with a molecular weight of less than 11,000 containing more than 60 percent of vinyl, a polybutadiene resin with polarity groups containing more than 60 percent of vinyl, and a maleic anhydride grafted polybutadiene styrene copolymer with a molecular weight of more than 50,000; (2) a fiberglass cloth in an amount of 10 to 35 by weight with respect to the composite material; (3) a powder filler in an amount of 25 to 55 by weight with respect to the composite material; and (4) a cure initiator in an amount of 1 to 3 by weight with respect to the composite material.

Step 2: mixing the thermosetting composition, the powder filler and the cure initiator, and diluting the resin system to an appropriate viscosity with solvent, evenly stirring and mixing to make the filler disperse evenly in the resin system, thereby obtaining a glue solution, then impregnating the fiberglass cloth with the glue solution, controlling the fiberglass cloth to be an appropriate thickness, and then removing the solvent to form prepregs;

Step 3: mutually overlapping a plurality of the prepregs, respectively covering a copper foil on both top and bottom surfaces of the overlapped prepregs, putting the copper foil and prepreg assembly into a press machine to cure at a curing temperature of 150° C.-300° C. and a curing pressure of 25 $Kg/cm^2$-70 $Kg/cm^2$, thereby forming the high-frequency circuit substrate.

The beneficial effects of the present invention are described as follows. Firstly, a high content vinyl-containing butadiene styrene copolymer resin having excellent dielectric properties is used whereby through many unsaturated double bonds in the resin for cross-linking reactions, the circuit substrate has the necessary high-frequency dielectric properties and high temperature resistance.

Secondly, a high content vinyl-containing polybutadiene resin with the polarity groups is used to improve the peel strength of the circuit substrate, and through the cross-linking of the vinyl groups, the circuit substrate has the necessary high temperature resistance.

Thirdly, a maleic anhydride grafted polybutadiene styrene copolymer with high molecular weight is used to further improve the peel strength of the circuit substrate. Also, the tackiness problem of the prepregs caused by using only liquid resin is improved by co-using solid resin and liquid resin.

In short, the composite material of the present invention permits easy manufacture of the prepreg, and good bonding of the copper foil. The high-frequency circuit substrate manufactured from the composite material has a low dielectric constant, a low dielectric loss tangent, excellent heat resistance, and is easy to fabricate. Thus, the composite material is suitable for manufacturing the circuit substrate for high-frequency electronic equipment.

DESCRIPTION OF THE PREFERRED EMBODIMENTS

The present invention is best understood from the following detailed description with reference to the accompanying embodiments.

I. Components of the Composite Material

1. The Resin System of the Thermosetting Composition

1. The resin system of the thermosetting composition The thermosetting composition in an amount of 15 to 50 by weight with respect to the total weight of the composite material, and preferably in an amount of 20 to 50 by weight, comprises: (1) a high content vinyl-containing butadiene styrene copolymer liquid resin with a molecular weight of less than 11,000; (2) a high content vinyl-containing polybutadiene liquid resin with polarity groups; and (3) a maleic anhydride grafted polybutadiene styrene solid copolymer with a molecular weight of more than 50,000.

Component (1) is a butadiene styrene copolymer resin with a molecular weight of less than 11,000, and preferably less than 7,000. The butadiene styrene copolymer resin is liquid at normal temperature (room temperature), and the viscosity of the liquid resin is very low, making it beneficial to the impregnation operation. The butadiene styrene copolymer resin is in an amount of 30 to 75 by weight with respect to total weight of the thermosetting composition. The content of 1,2-addition vinyl is more than 60 percent in its molecular structure, and preferably at least 70 percent. The high content vinyl-containing butadiene styrene copolymer resin provides a great quantity of unsaturated vinyl for the curing cross-linked reaction, increases cross-linking density in the curing process, and provides the circuit substrate with adequate high temperature resistance. In addition, the butadiene styrene copolymer resin has a better rigid benzene ring in its molecular structure. Compared to the butadiene resin according to the conventional patent, the rigidity and mechanical strength of the present resulting sheet is better. The preferable butadiene styrene copolymer resin is the Ricon 104H (made by Sartomer Company) and Ricon 100 resin (Sartomer) with the content of the 1,2-addition vinyl in its molecular structure being at least 70%.

Component (2) is a high content vinyl-containing polybutadiene resin with polarity groups, which is completely different from polybutadiene resin due to the polarity groups in its molecular structure. The polarity groups existing in the molecular structure improve the peel strength of the copper foils. The polarity groups are selected from amino groups, maleic anhydride groups, epoxy groups, acrylic groups, methyl acrylate, and so on. The high content vinyl-containing polybutadiene resin with the polarity groups is a liquid resin, in an amount of 5 to 30 by weight with respect to the thermosetting composition. The high content vinyl-containing polybutadiene resin with the polarity groups in an amount of less than 5 can not improve the peel strength, and in an amount of more than 30 makes dielectric properties deteriorate. In order to obtain a good cross-linking effect, the content of 1,2-addition vinyl must be more than 60 percent in its molecular structure, and preferably more than or equal to 70 percent. As a high content vinyl-containing polybutadiene liquid resin with the polarity groups, it can be selected from amine modifer polybutadiene resin, maleic anhydride modified polybutadiene resin, epoxy modified polybutadiene resin, acrylate modified polybutadiene resin, hydroxyl terminated polybutadiene resin, carboxyl terminated polybutadiene resin or a combination thereof, and preferably selected from maleic anhydride modified polybutadiene resin, for example: BN1015 (Japan Caoda), and Ricon 156MA17 (Sartomer Company).

Components (1) and (2) are liquid at room temperature. If the prepregs are made only from components (1) and (2), a tackiness problem will occur, which is not beneficial to the following lamination process operation. Consequently, solid component (3) is introduced to improve the tackiness problem of the prepregs.

Component (3) is a maleic anhydride grafted polybutadiene styrene copolymer with a molecular weight of more than 50,000, in an amount of 15 to 55 by weight with respect to the thermosetting composition. In the present invention, adding maleic anhydride grafted polybutadiene styrene copolymer of high molecular weight, is to improve the tackiness problem of the prepreg, and also to improve the peel strength of the sheet through the polarity groups of the maleic anhydride. In the process of making the prepreg, when the fiberglass cloth is impregnated in the liquid resin and the solvent is removed in the drying process, the components of the resin will be re-distributed on the prepreg. The low-molecular-weight liquid resin will enter the internal gaps, of the fiberglass cloth. The high-molecular-weight maleic anhydride grafted polybutadiene styrene copolymer cannot easily enter the internal gaps of the fiberglass cloth, but only distributes on the surface of the prepreg, due to its high molecular weight. Thus, in the process of the lamination, the surface of the prepreg contacted with the copper coil has the polarity groups, and so can effectively increase the peel strength. The maleic anhydride grafted polybutadiene styrene copolymer available can be FG1901X (Kraton), FG1924X (Kraton).

2. Powder Filler

In the composite material of the present invention, the powder filler is employed to increase the solid content of the glue liquid, to improve the tack-free properties of the prepreg, to improve the dimensional stability, and to reduce CTE. The powder filler of the present invention is in an amount of 25 to 55 by weight with respect to the composite material (according to the total weight of composite material). The powder filler can be selected from crystalline silica, amorphous silica, spherical silica, titanium dioxide, strontium titanate, barium titanate, boron nitride, aluminium nitride, silicon carbide, aluminum, glass fibers, polyethylene tetrafluoroethylene, polyphenylene sulfide, polyether sulfones, and combinations thereof. The above powder filler can be used separately or together. Preferably, the powder filler is silica. The particle size medium value of the filler is 1-15 μm, and preferably is 1-10 μm. The filler with the particle size medium value of 1-10 μm has good dispersion in the liquid resin. For example, the silica filler is CE441 (CE minerals company), FB-35 (Denka company), or 525 (Sibelco companies).

3. Fiberglass Cloth

In the composite material of the present invention, the fiberglass cloth is employed to improve the size stability of the substrate, and reduce contraction of laminate resin in curing process. The fiberglass cloth is in an amount of 10 to 35 by weight with respect to the composite material (according to the total weight of composite material), and preferably in an amount of 15 to 35. According to different requirements of substrates, different fiberglass clothes can be used. Specifications of different fiberglass clothes are listed as the following table:

TABLE 1

| kind | thickness (mm) | manufacturer |
| --- | --- | --- |
| 7628 | 0.18 | Shanghai honghe |
| 2116 | 0.094 | Shanghai honghe |
| 1080 | 0.056 | Shanghai honghe |
| 106 | 0.04 | Shanghai honghe |

4. Flame Retardant

In the present invention, flame retardant can be added to improve the fire-retardant properties of the sheet. The fire retardant of present invention is in an amount of 0 to 35 by weight with respect to the composite material (according to the total weight of composite material). Brominate-containing flame retardant or phosphorous-containing flame retardant can be used. The preferable flame retardant will not reduce dielectric properties. The preferable brominate-containing flame retardant is decabromodiphenylether, decabromodiphenylethane or ethylenebis tetrabromophthalimide. The preferable phosphorus-containing flame retardant is tris (2,6-dimethylphenyl)phosphin, 10-(2,5-dihydroxyphenyl)-9,10-dihydro-9-oxa-10-phosphaphenanthrene-10-Oxide, 2,6-(2,6-dimethylphenyl)phosphino phenyl, or 10-phenyl-9,10-dihydro-9-oxa-10-phosphine Philippine-10-xide.

5. Cure Initiator

In the composite material of the present invention, the cure initiator is employed to accelerate the reaction. When the composite material is healed, the cure initiator is decomposed into free radicals which enable the molecular chain of the polymer to cross-link. The cure initiator is in an amount of 1% to 10% with respect to the amount of thermosetting composition, and is roughly in an amount of 1 to 3 by weight with respect to the composite material (according to the total weight of composite material). The cure initiator is selected from materials producing free radicals. The preferable cure initiator is peroxide, dicumyl peroxide, tert-butyl peroxybenzoate or 2,5-bis(2-ethylhexanoylperoxy)-2,5-dimethylhexane.

6. Auxiliary Crosslinking Agent

In the composite material of the present invention, a certain amount of auxiliary crosslinking agent can be added to improve cross-linking density. For example, the auxiliary crosslinking agent can be selected from triallyl isocyanurate, triallyl cyanurate, divinylbenzene or multifunction acrylate.

II: High-Frequency Circuit Substrate Made From the Composite Material

A method of making the high-frequency circuit substrate made from the composite material, including the following steps:

Step 1: providing components of the composite material, the components comprising: (1) a thermosetting composition in an amount of 15 to 50 by weight with respect to the composite material (according to the total weight of the composite material), comprising: a butadiene styrene copolymer resin with a molecular weight of less than 11,000 containing more than 60 percent of vinyl, a polybutadiene resin with polarity groups containing more than 60 percent of vinyl, and a maleic anhydride grafted polybutadiene styrene copolymer with a molecular weight of more than 50,000; (2) a fiberglass cloth in an amount of 10 to 35 by weight with respect to the composite material; (3) a powder filler in an amount of 25 to 55 by weight with respect to the composite material; and (4) a cure initiator in an amount of 1 to 3 by weight with respect to the composite material.

Step 2: mixing the thermosetting composition, the powder filler, a flame retardant and the cure initiator, diluting the resin system to an appropriate viscosity with solvent, evenly stirring and mixing to make the filler disperse evenly in the resin system, thereby obtaining a glue solution, impregnating the fiberglass cloth with the glue solution, controlling the fiberglass cloth to be an appropriate thickness, and then removing the solvent to form prepregs.

Step 3: mutually overlapping a plurality of prepregs, respectively covering a copper foil on both top and bottom surfaces of the overlapped prepregs, putting them into a press machine to cure at a curing temperature of 150° C.-300° C. and a curing pressure of 25 Kg/cm$^2$-70 Kg/cm$^2$, thereby forming the high-frequency circuit substrate.

The high-frequency circuit substrate comprises: a plurality of prepregs mutually overlapped, and copper foils respectively covered on both sides of the overlapped prepregs. Each prepreg is made from the composite material.

The properties of the above high-frequency circuit board, such as dielectric properties (dielectric constant and dielectric loss tangent), high-frequency properties and heat resistance, will be best understood from the following detailed explanation and description with reference to the accompanying embodiments.

The components of composite material in the embodiments of present invention is selected as the following table:

TABLE 2

| Manufacturer | Name or trademark | The content of the material |
|---|---|---|
| Sartomer | Ricon 100 | polybutadiene styrene copolymer resin, Mn = 4500, 1,2-vinly = 70% |
| Sartomer | Ricon 156MA17 | maleic anhydride additon polybutadiene resin, Mn = 2500, 1,2-vinly = 70% |
| Kraton | FG1901X | maleic anhydride grafted polybutadiene styrene block copolymer |
| Sibelco | 525 | amorphous silica |
| Albemarle | SAYTEX8010 | decabromodiphenylethane |
| Shanghai gaoqiao | DCP | dicumyl peroxide |
| Shanghai honghe | 1080 Fiberglass cloth | thickness 0.05 mm, weight 48 g/m2 |

Embodiment 1

Butadiene styrene copolymer liquid resin Ricon100 in an amount of 55.6 by weight, maleic anhydride additon polybutadiene resin Ricon156MA17 in an amount of 15 by weight, maleic anhydride grafted polybutadiene styrene copolymer FG1901X in an amount of 29.4 by weight, silica (525) in an amount of 85 by weight, fire retardant SAYTEX8010 in an amount of 32 by weight, and cure initiator DCP in an amount of 2.4 by weight are mixed and diluted to an appropriate viscosity with the solvent xylene, and then evenly stirred and mixed to make the filler disperse evenly in the resin system, thereby obtaining a glue solution. The fiberglass cloth 1080 is provided and impregnated with the glue solution. Then the fiberglass cloth is dryed to remove the solvent thereby forming prepregs. Since the prepreg is non-tacky, the process operation is simple. Eight prepregs are overlapped, and two copper foils with thickness of 1 oz separately cover on both top and bottom surfaces of the overlapped prepregs. The assembly of two copper foils and eight prepregs is put into a press machine to cure for 1 hour with a curing pressure of 50 Kg/cm² and a curing temperature of 170° C., and then heated to 300° C. to postcure for 30 minutes thereby making the circuit substrate. The physical data is shown in table 3.

Embodiment 2

The process of embodiment 2 is similar to embodiment 1, but the ratio of the composite material is changed as shown in table 3.

Embodiment 3

The process of embodiment 3 is similar to embodiment 1, but the ratio of the composite material is changed as shown in table 3.

Comparison Example

The process of comparison example is similar to embodiment 1. Maleic anhydride additon polybutadiene resin Ricon 156MA17, and maleic anhydride grafted polybutadiene styrene copolymer FG1901X are replaced with TE2000 (Japan Synthetic Rubber Industry Company) which is polybutadiene styrene block copolymer without polarity groups. The ratio of the material is shown in table 3.

TABLE 3

| Materials and Properties | Embodiment 1 | Embodiment 2 | Embodiment 3 | Comparison example |
|---|---|---|---|---|
| Ricon 100 | 55.6 | 62 | 38 | 70 |
| FG1901X | 29.4 | 18 | 42 | 0 |
| TE2000 | 0 | 0 | 0 | 30 |
| Ricon 156MA17 | 15 | 20 | 10 | 0 |
| 525 | 85 | 240 | 45 | 85 |
| DCP | 6.5 | 7.5 | 5.6 | 5.8 |
| SAYTEX8010 | 32 | 35 | 0 | 28 |
| 1080Fiberglass cloth | 80.7 | 125 | 78 | 92 |
| peel strength (N/mm) | 0.94 | 0.91 | 1.05 | 0.52 |
| dielectric constant (10 GHZ) | 3.18 | 3.45 | 3.15 | 3.15 |
| dielectric loss tangent (10 GHZ) | 0.0042 | 0.004 | 0.0047 | 0.0026 |
| solder leach resistance 288° C., (s) | >120 | >120 | >120 | >120 |

Physical Analysis

From the physical data of diagram 3, the circuit substrates made in embodiments 1, 2 and 3 have low dielectric constant, low dielectric loss tangent, and excellent high-frequency properties. Comparing embodiments 1, 2 and 3 with comparison example, maleic anhydride additon polybutadiene resin with low molecular weight and maleic anhydride grafted polybutadiene styrene copolymer with high molecular weight are introduced to effectively improve the peel strength and reduce dielectric constant and dielectric loss tangent.

As mentioned above, compared to the general circuit substrate, the circuit substrate made from the composite material of the present invention has superior dielectric properties (low dielectric constant and low dielectric loss tangent), and has excellent heat resistance, and high peel strength. Therefore, the composite material of the present invention is suitable for manufacturing the circuit substrate for high-frequency electronic equipment.

Although the present invention has been described in detail with the above said preferred embodiments, this is not to limit the scope of the invention. Thus, all the modifications and changes according to the characteristic and spirit of the present invention, are involved in the protected scope of the invention.

What is claimed is:
1. A composite material comprising:
(1) a thermosetting composition in an amount of 15 to 50 by weight with respect to the composite material (according to the total weight of the composite material), comprising a butadiene styrene copolymer resin with a molecular weight of less than 11,000 containing more than 60 percent of vinyl, a polybutadiene resin with polarity groups containing more than 60 percent of vinyl, and a maleic anhydride grafted polybutadiene styrene copolymer with a molecular weight of more than 50,000;

(2) a fiberglass cloth in an amount of 10 to 35 by weight with respect to the composite material;

(3) a powder filler in an amount of 25 to 55 by weight with respect to the composite material; and (4) a cure initiator in an amount of 1 to 3 by weight with respect to the composite material.

2. The composite material of claim 1, wherein said butadiene styrene copolymer resin is a liquid resin, in an amount of 30 to 75 by weight with respect to the thermosetting composition, and has an 1,2-addition with vinyl, and the content of vinyl is at least 70%.

3. The composite material of claim 1, wherein said polybutadiene resin with the polarity groups is a liquid resin, in an amount of 5 to 30 by weight with respect to the thermosetting composition, and has an 1,2-addition with vinyl, the content of vinyl is at least 70%, and said polybutadiene liquid resin with the polarity groups is selected from amine modifer polybutadiene resin, maleic anhydride modified polybutadiene resin, epoxy modified polybutadiene resin, acrylate modified polybutadiene resin, hydroxyl terminated polybutadiene resin, carboxyl terminated polybutadiene resin, or a combination thereof.

4. The composite material of claim 1, wherein said maleic anhydride grafted polybutadiene styrene copolymer of molecular weight more than 50,000 is a solid resin, in an amount of 15 to 55 by weight with respect to the thermosetting composition.

5. The composite material of claim 1, wherein said powder filler is selected from crystalline silica, amorphous silica, spherical silica, titanium dioxide, strontium titanate, barium titanate, boron nitride, aluminium nitride, silicon carbide, aluminum, glass fiber, polytetrafluoroethylene, polyphenylene sulfide, polyether sulfones, or a combination thereof.

6. The composite material of claim 1, further comprising a brominate- or phosphorus-containing flame retardant, in an amount of 0 to 35 by weight with respect to the composite material, wherein said brominate-containing flame retardant is selected from decabromodiphenyl ether, decabromodiphenylethane or ethylenebis tetrabromophthalimide, and said phosphorus-containing flame retardant is selected from tris(2,6-dimethylphenyl)phosphin, 10-(2,5-dihydroxyphenyl)-9,10-dihydro-9-oxa-10-phosphaphenanthrene-10-oxide, 2,6-(2,6-dimethylphenyl)phosphino phenyl or 10-phenyl-9,10-dihydro-9-oxa-10-phosphine Philippine-10-oxide.

7. The composite material of claim 1, wherein said cure initiator is selected from peroxide, dicumyl peroxide, tert-butyl peroxybenzoate or 2,5-bis(2-ethylhexanoylperoxy)-2,5-dimethylhexane.

8. The composite material of claim 1, further comprising an auxiliary crosslinking agent, wherein said auxiliary crosslinking agent is selected from triallyl isocyanurate, triallyl cyanurate, divinylbenzene or multifunction acrylate.

9. A high-frequency circuit substrate made from the composite material of claim 1 comprising: a plurality of prepregs mutually overlapped, and copper foils respectively disposed at both sides of the overlapped prepregs, each said prepreg being made from said composite material.

10. A method of making the high-frequency circuit substrate of claim 9, comprising the following steps:

Step 1: providing components of the composite material, comprising (1) a thermosetting composition in an amount of 15 to 50 by weight with respect to the composite material (according to the total weight of the composite material), comprising a butadiene styrene copolymer resin with a molecular weight of less than 11,000 containing more than 60 percent of vinyl, a polybutadiene resin with polarity groups containing more than 60 percent of vinyl, and a maleic anhydride grafted polybutadiene styrene copolymer with a molecular weight of more than 50,000; (2) a fiberglass cloth in an amount of 10 to 35 by weight with respect to the composite material; (3) a powder filler in an amount of 25 to 55 by weight with respect to the composite material; and (4) a cure initiator in an amount of 1 to 3 by weight with respect to the composite material;

Step 2: mixing said thermosetting composition, powder filler and cure initiator and diluting the resin system to an appropriate viscosity with solvent, evenly stirring and mixing to make the filler disperse evenly in the resin system thereby obtaining a glue solution, then impregnating the fiberglass cloth in said glue solution and controlling the fiberglass cloth to be an appropriate thickness, and removing the solvent to form prepregs;

Step 3: overlapping a plurality of said prepregs, respectively covering a copper foil on both top and bottom surfaces of the overlapped prepregs, putting the prepregs and copper foil assembly into a press machine to cure at a curing temperature of 150° C.-300° C. and a curing pressure of 25 Kg/cm$^2$-70 Kg/cm$^2$, thereby forming said high-frequency circuit substrate.

* * * * *